(12) United States Patent
Chudzik et al.

(10) Patent No.: US 8,753,936 B2
(45) Date of Patent: Jun. 17, 2014

(54) CHANGING EFFECTIVE WORK FUNCTION USING ION IMPLANTATION DURING DUAL WORK FUNCTION METAL GATE INTEGRATION

(75) Inventors: Michael P. Chudzik, Danbury, CT (US); Martin M. Frank, Dobbs Ferry, NY (US); Herbert L. Ho, New Windsor, NY (US); Mark J. Hurley, Poughkeepsie, NY (US); Rashmi Jha, Toledo, OH (US); Naim Moumen, Walden, NY (US); Vijay Narayanan, New York, NY (US); Dae-Gyu Park, Poughquag, NY (US); Vamsi K. Paruchuri, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 1056 days.

(21) Appl. No.: 12/190,220

(22) Filed: Aug. 12, 2008

(65) Prior Publication Data

US 2010/0038725 A1     Feb. 18, 2010

(51) Int. Cl.
*H01L 21/8234*     (2006.01)

(52) U.S. Cl.
USPC ..................................... 438/275; 257/E27.06

(58) Field of Classification Search
USPC ............ 257/288, 350, E27.06; 438/199, 591, 438/275
See application file for complete search history.

(56) References Cited

U.S. PATENT DOCUMENTS

| | | | |
|---|---|---|---|
| 6,660,608 B1 | 12/2003 | Buynoski | |
| 6,794,234 B2 | 9/2004 | Polishchuk et al. | |
| 7,344,934 B2 | 3/2008 | Li | |
| 2001/0033027 A1 | 10/2001 | Akram et al. | |
| 2002/0094652 A1 | 7/2002 | Akram et al. | |
| 2002/0100981 A1 | 8/2002 | Akram et al. | |
| 2002/0197857 A1 | 12/2002 | Akram et al. | |
| 2003/0180994 A1* | 9/2003 | Polishchuk et al. | 438/199 |
| 2004/0106261 A1 | 6/2004 | Huotari et al. | |
| 2008/0157228 A1* | 7/2008 | Chambers et al. | 257/407 |
| 2008/0191286 A1* | 8/2008 | Chang et al. | 257/369 |

FOREIGN PATENT DOCUMENTS

| | | |
|---|---|---|
| JP | 2002237589 | 8/2002 |
| JP | 2003273350 | 9/2003 |
| JP | 2004111549 | 4/2004 |

(Continued)

OTHER PUBLICATIONS

Cartier et al., "Role of Oxygen Vacancies in Vfb/Vt stability of pFET metals on HfO2," Symposium on VLSI Technology Digest of Technical Papers, 2005, pp. 230-231.

(Continued)

*Primary Examiner* — Kimberly Rizkallah
*Assistant Examiner* — Duy T Nguyen
(74) *Attorney, Agent, or Firm* — Joseph J. Petrokaitis; Hoffman Warnick LLC

(57) ABSTRACT

Ion implantation to change an effective work function for dual work function metal gate integration is presented. One method may include forming a high dielectric constant (high-k) layer over a first-type field effect transistor (FET) region and a second-type FET region; forming a metal layer having a first effective work function compatible for a first-type FET over the first-type FET region and the second-type FET region; and changing the first effective work function to a second, different effective work function over the second-type FET region by implanting a species into the metal layer over the second-type FET region.

14 Claims, 5 Drawing Sheets

(56) References Cited

FOREIGN PATENT DOCUMENTS

| | | |
|---|---|---|
| JP | 2004207481 | 7/2004 |
| JP | 2005191354 | 7/2005 |
| JP | 2006-157015 A | 6/2006 |
| JP | 2007123867 | 5/2007 |
| JP | 2007-157739 A | 6/2007 |
| JP | 2008016798 | 1/2008 |
| JP | 2008091556 | 4/2008 |

OTHER PUBLICATIONS

PCT International Search Search With Written Opinion; Sep. 15, 2009, 8 pages.
International Search Report dated Sep. 15, 2009.
Application No. 2011-523066, JPO Office Action dated Jul. 16, 2013.

* cited by examiner

US 8,753,936 B2

CHANGING EFFECTIVE WORK FUNCTION USING ION IMPLANTATION DURING DUAL WORK FUNCTION METAL GATE INTEGRATION

BACKGROUND

1. Technical Field

The disclosure relates generally to integrated circuit (IC) chip fabrication, and more particularly, to dual effective work function metal gate integration.

2. Background Art

The continued scaling of complementary metal-oxide semiconductor (CMOS) devices requires successful integration of dual work function metal gate electrodes on high dielectric constant (high-k) gate dielectrics.

BRIEF SUMMARY

Ion implantation to change an effective work function for dual effective work function metal gate integration is presented. One method may include forming a high dielectric constant (high-k) layer over a first-type field effect transistor (FET) region and a second-type FET region; forming a metal layer having a first effective work function compatible for a first-type FET over the first-type FET region and the second-type FET region; and changing the first effective work function to a second, different effective work function over the second-type FET region by implanting a species into the metal layer over the second-type FET region.

A first aspect of the disclosure provides a method comprising: forming a high dielectric constant (high-k) layer over a first-type field effect transistor (FET) region and a second-type FET region; forming a metal layer having a first effective work function compatible for a first-type FET over the first-type FET region and the second-type FET region; and changing the first effective work function to a second, different effective work function over the second-type FET region by implanting a species into the metal layer over the second-type FET region.

A second aspect of the disclosure provides a method comprising: forming a high dielectric constant (high-k) layer and a metal layer over the high-k layer, the metal layer having a first effective work function; changing the first effective work function to a second, different effective work function in a region by implanting a species into the metal layer over the region; and forming a first-type FET compatible with the first effective work function over an area outside the region and forming a second-type FET compatible with the second effective work function over the region.

A third aspect of the disclosure provides a structure comprising: a first-type field effect transistor (FET) including a gate having a high dielectric constant (high-k) layer and a metal layer, the metal layer having a first effective work function; and a second-type FET including the high-k layer and the metal layer, the metal layer further including an implanted species that changes the first effective work function to a different second effective work function.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
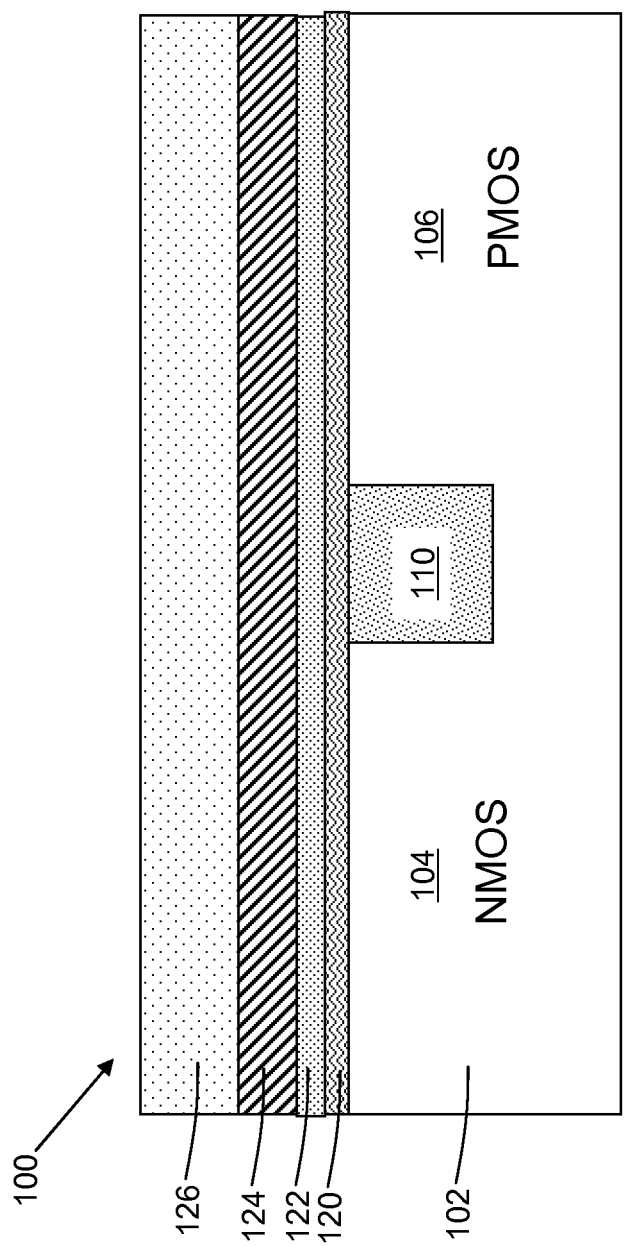
FIGS. 1-3 show embodiments of a method according to the disclosure.

It is noted that the drawings of the disclosure are not to scale. The drawings are intended to depict only typical aspects of the disclosure, and therefore should not be considered as limiting the scope of the disclosure. In the drawings, like-numbering represents like-elements when comparing between drawings.

DETAILED DESCRIPTION

Figure 2:
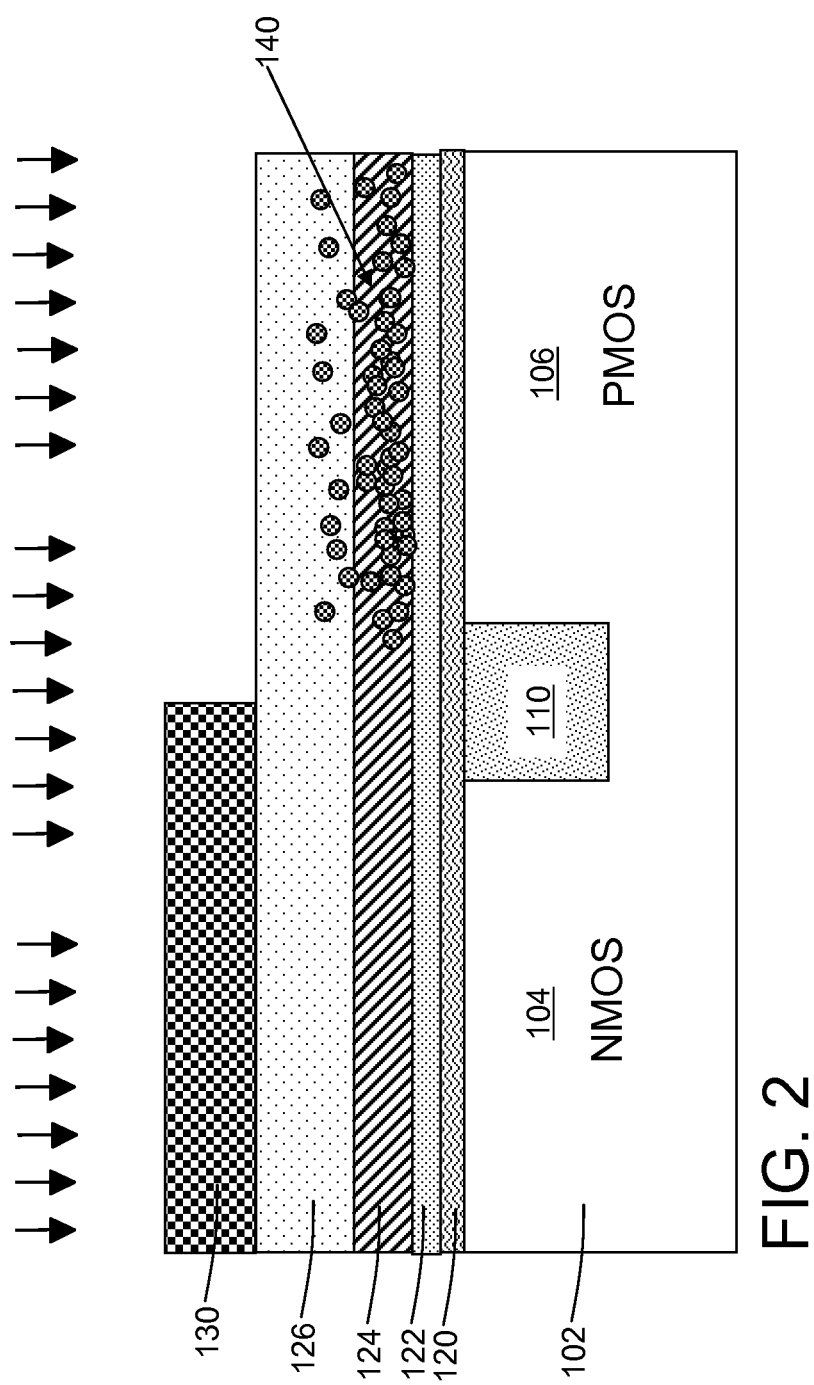
Figure 3:
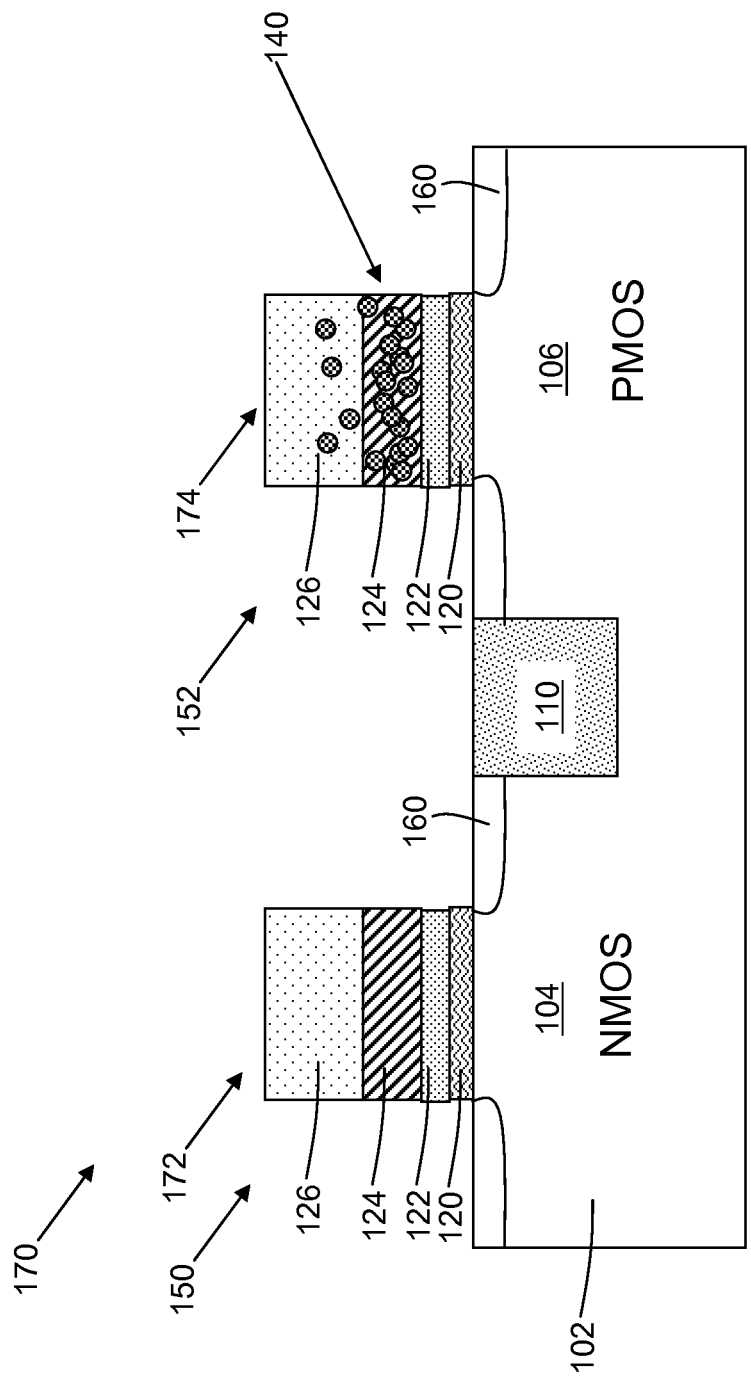

Turning to the drawings, FIGS. 1-3 show embodiments of a method according to the disclosure. FIG. 1 shows a preliminary structure 100 including a substrate 102 having trench isolated regions 104, 106 for an n-type field effect transistor (NFET) and a p-type FET (PFET), respectively. As understood, the position of the types of FETs may be reversed so long as they are of opposite polarity. Hereinafter, region 104 is referred to as first-type FET region and region 106 is referred to as second-type FET region. Substrate 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$ where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). Furthermore, a portion or entire semiconductor substrate may be strained. Trench isolation 110 may include any now known or later developed insulative material, e.g., silicon oxide. Substrate 102 and trench isolation 110 may be formed using any now known or later developed techniques.

FIG. 1 also shows optionally forming a gate dielectric layer 120 over substrate 102. Gate dielectric layer 120 may include any now known or later developed high-k dielectric (k equal to or >3.9) material such as hafnium silicate (HfSi), hafnium oxide ($HfO_2$), lanthanum oxide ($LaO_2$), zirconium silicate ($ZrSiO_x$), zirconium oxide($ZrO_2$), silicon oxide ($SiO_2$), silicon nitride ($Si_3N_4$), silicon oxynitride (SiON), high-k material or any combination of these materials. Forming as used herein may include any appropriate depositing technique(s) appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

FIG. 1 also shows forming a high dielectric constant (high-k) layer 122 over first-type FET 104 region and second-type FET region 106. High-k layer 122 may include but is not limited to tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). Dielectric layer 120 and 122 may be single layer.

A metal layer 124 may be formed over high-k layer 122 and over first-type FET region 104 and second-type FET region 106. Metal layer 124 may include, for example, elemental metals such as tungsten (W), tantalum (Ta), aluminum (Al), ruthenium (Ru), platinum (Pt), etc. or any electrically conductive compound including but not limited to titanium nitride (TiN), tantalum nitride (TaN), nickel silicide (NiSi), nickel-platinum silicide (NiPtSi), titanium nitride (TiN), tantalum nitride (TaN), titanium carbide (TiC), tantalum carbide (TaC), tantalum carbide oxynitride (TaCNO), ruthenium oxide ($RuO_2$), etc., and mixtures and multi-layers thereof. In any event, metal layer 124 exhibits a first effective work function compatible with a FET to be formed over one of first type FET region 104 or second type FET region 106. As shown in FIG. 1, a silicon layer 126 may also be formed over metal layer 124. Conventional dual work function metal gate integration techniques would, at this point, require removal of metal layer over a selected one of regions 104, 106 and deposition of another metal having a work function compatible with the FET to be formed over that selected region.

In contrast to conventional techniques, however, as shown in FIG. 2, first effective work function of metal layer 124 is changed to a second, different effective work function over the second-type FET region 106 by implanting a species 140 into metal layer 124 over second-type FET region 106. "Effective work function" does not necessarily mean modulation of the metal 'work function', which is commonly understood to mean 'vacuum work function'. Rather, certain embodiments may rely on diffusion of the implanted species into the dielectric stack, instead shifting threshold voltage by other mechanisms such as fixed charge or electrostatic dipoles due to different electro-negativities of the elements involved. In one embodiment, one of regions 104, 106 may be masked (first-type FET region 104 as shown) using any now known or later developed mask 130. However, a mask may not be necessary if implanting accurate enough to cover only one of the regions is available. In one embodiment, aluminum (Al) is used as the selected species, but other rare earth metal species may also be employed such as lanthanum (La), iridium (Ir), platinum (Pt), ruthenium (Ru), magnesium (Mg), strontium (Sr) or barium (Ba). Silicon layer 126 (and dielectric layer 120 and/or 122) may also be implanted with the species. Implanting may occur using any now known or later developed implanting technique, e.g., beam implant, plasma implant, etc.

FIG. 3 shows forming a first-type FET 150 compatible with first effective work function over first-type FET region 104 (an area outside second-type region 106) and forming a second-type FET 152 compatible with the second effective work function over second-type FET region 106. Part of FET formation includes implanting and annealing to form source/drain regions 160. Other processing such as forming spacers, silicide contacts, etc., has been omitted for clarity.

Figure 4:
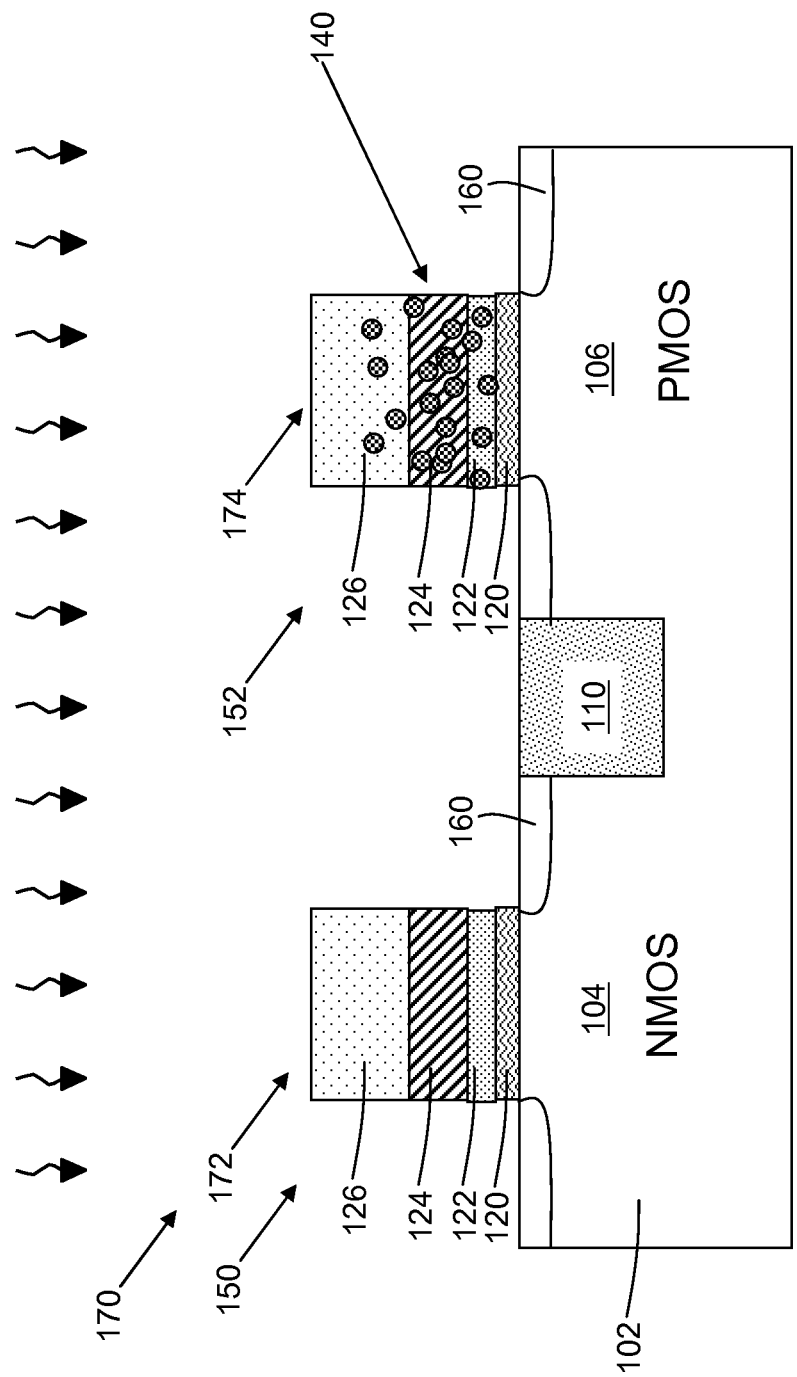
FIG. 4 shows embodiments of a structure according to the disclosure.

Implanted species 140 in high-k dielectric 122 creates a dipole between a bottom of high-k dielectric 122 and substrate 102 such that a effective work function of metal layer 124 is not specific to a top of metal layer 124 but to a bottom of high-k dielectric 122, thus shifting the effective work function of metal layer 124 over second-type FET region 106. As shown in FIG. 4, species 140 may also diffuse through high-k dielectric 122, e.g., during annealing that may occur as part of source/drain region 160 formation or other processing. Metal layer 124 acts as a screen layer to prevent too much diffusion of species 140 into high-k dielectric 122. As indicated, silicon layer 126 absorbs some of species 140. As an added benefit, species 140 implantation also acts to retard boron diffusion to a channel where second-type FET region 106 is for a PFET.

FIG. 4 also shows a structure 170 comprising a first-type FET 150 including a gate 172 having high-k layer 122 and metal layer 124, the metal layer having a first effective work function. Structure 170 also includes second-type FET 152 including a gate 174 having high-k layer 122 and metal layer 124, but with the metal layer further including an implanted species 140 that changes the first effective work function to a different second effective work function.

Figure 5:
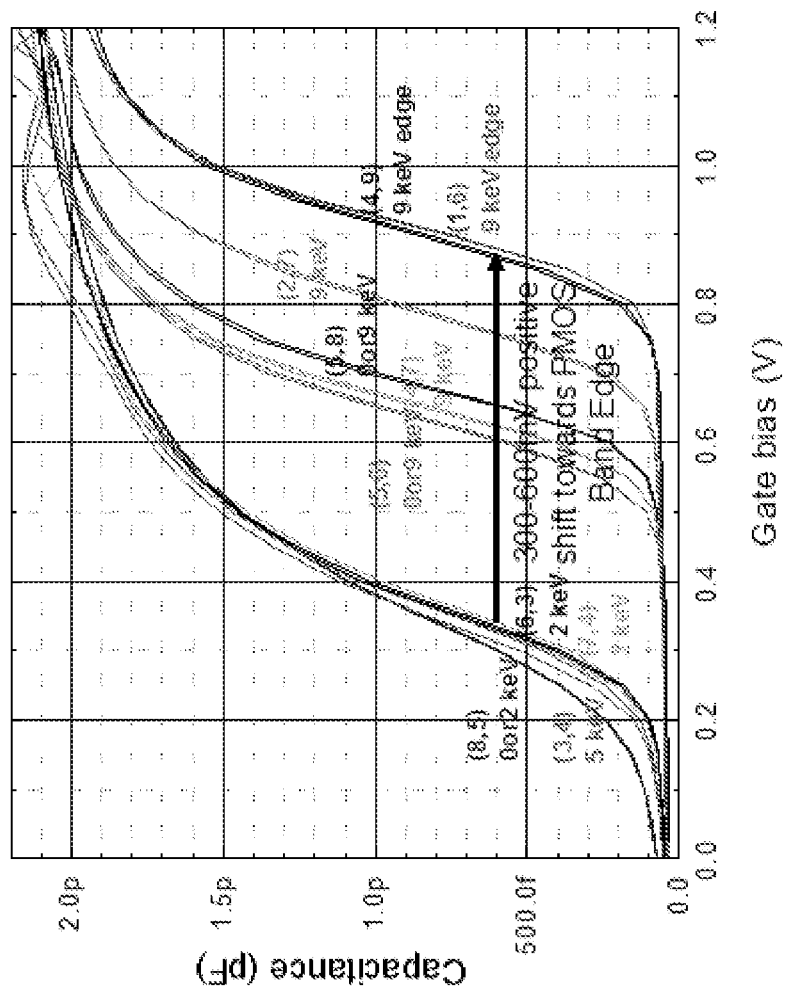
FIG. 5 shows a graph illustrating a threshold voltage shift achievable using the teachings of the disclosure.

FIG. 5 shows a graph illustrating a threshold voltage shift capability of the methods according to the disclosure. In one embodiment, a threshold voltage shift of greater than a 50 milli-Volt shift for second-type FET is possible. This is a significant improvement over conventional processing during which ratios of, for example, titanium, nitride and aluminum are controlled during a reactive co-sputtering of titanium and aluminum in a nitrogen ambient. In another embodiment, a threshold voltage shift of approximately 600 milli-Volts may be possible such that the threshold voltage shift between the NFET and the PFET approaches a band edge threshold voltage shift of the PFET.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
forming a high dielectric constant (high-k) layer over a first-type field effect transistor (FET) region and a second-type FET region;
forming a single metal layer having a first effective work function compatible for a first-type FET over the first-type FET region and the second-type FET region; and
changing the first effective work function to a second, different effective work function over the second-type FET region by implanting an aluminum (Al) species into the single metal layer over the second-type FET region, wherein the changing results in a greater than 50 milli-Volt shift in a threshold voltage of the second-type FET and wherein the aluminum species diffuses into the high dielectric constant layer.

2. The method of claim 1, further comprising forming the first-type FET over the first-type FET region and a second-type FET over the second-type FET region.

3. The method of claim 1, further comprising forming a silicon layer over the metal layer prior to the changing, wherein the implanting includes implanting the aluminum species into the silicon.

4. The method of claim 1, wherein the metal layer is selected from the group consisting of: tungsten (W), tantalum (Ta), aluminum (Al), ruthenium (Ru), platinum (Pt), titanium nitride (TiN), tantalum nitride (TaN), nickel silicide (NiSi), nickel-platinum silicide (NiPtSi), titanium carbide (TiC), tantalum carbide (TaC), tantalum carbide oxynitride (TaCNO), ruthenium oxide (RuO$_2$), and mixtures and multi-layers thereof.

5. The method of claim 1, wherein the changing includes masking the first-type FET region.

6. The method of claim 1, wherein the changing further includes annealing.

7. The method of claim 6, wherein the annealing is part of a source/drain region forming for the first-type and second-type FETs.

8. The method of claim 1, further comprising forming a gate dielectric layer prior to forming the high-k layer.

9. A method comprising:
forming a high dielectric constant (high-k) layer and a single metal layer over the high-k layer, the single metal layer having a first effective work function;
changing the first effective work function to a second, different effective work function in a region by implanting an aluminum (Al) species into the single metal layer over the region; and
forming a first-type FET compatible with the first effective work function over an area outside the region and forming a second-type FET compatible with the second effective work function over the region, wherein the changing results in a greater than 50 milli-Volt shift in a threshold voltage of the second-type FET and wherein the aluminum species diffuses into the high dielectric constant layer.

10. The method of claim 9, further comprising forming a polysilicon layer over the metal layer prior to the changing, wherein the implanting includes implanting the aluminum species into the polysilicon.

11. The method of claim 9, wherein the metal layer is selected from the group consisting of: tungsten (W), tantalum (Ta), aluminum (Al), ruthenium (Ru), platinum (Pt), titanium nitride (TiN), tantalum nitride (TaN), nickel silicide (NiSi), nickel-platinum silicide (NiPtSi), titanium carbide (TiC), tantalum carbide (TaC), tantalum carbide oxynitride (TaCNO), ruthenium oxide (RuO$_2$), and mixtures and multi-layers thereof.

12. The method of claim 9, wherein the changing includes masking the area outside of the region.

13. The method of claim 9, wherein the first-type and second-type FET formings include annealing.

14. The method of claim 13, wherein the annealing is part of a source/drain region forming for the first-type and second-type FETs.

* * * * *